United States Patent
Honda et al.

(10) Patent No.: US 8,797,086 B2
(45) Date of Patent: Aug. 5, 2014

(54) SWITCHING DEVICE

(71) Applicant: Panasonic Corporation, Osaka (JP)

(72) Inventors: Yosiaki Honda, Kyoto (JP); Yuichi Inaba, Osaka (JP)

(73) Assignee: Panasonic Corporation, Osaka (JP)

( * ) Notice: Subject to any disclaimer, the term of this patent is extended or adjusted under 35 U.S.C. 154(b) by 21 days.

(21) Appl. No.: 13/802,751

(22) Filed: Mar. 14, 2013

(65) Prior Publication Data

US 2013/0200940 A1  Aug. 8, 2013

(51) Int. Cl.
*H03K 17/56* (2006.01)
*H03K 17/06* (2006.01)

(52) U.S. Cl.
CPC ........ *H03K 17/56* (2013.01); *H03K 2217/0063* (2013.01); *H03K 17/06* (2013.01)
USPC .......................................... 327/419; 327/108

(58) Field of Classification Search
None
See application file for complete search history.

(56) References Cited

U.S. PATENT DOCUMENTS

| | | | |
|---|---|---|---|
| 7,834,380 B2 * | 11/2010 | Ueda et al. ...................... | 257/192 |
| 8,232,580 B2 * | 7/2012 | Nozaki ......................... | 257/187 |
| 2010/0097105 A1 | 4/2010 | Morita et al. | |
| 2010/0117119 A1 * | 5/2010 | Uesugi et al. ................. | 257/194 |
| 2011/0215379 A1 | 9/2011 | Ikoshi et al. | |
| 2012/0153930 A1 * | 6/2012 | Goto ............................ | 323/311 |

FOREIGN PATENT DOCUMENTS

| | | |
|---|---|---|
| JP | 2009-060049 | 3/2009 |
| JP | 2010-176885 | 8/2010 |

* cited by examiner

*Primary Examiner* — Cassandra Cox
(74) *Attorney, Agent, or Firm* — Panasonic Patent Center

(57) ABSTRACT

The present invention provides a switching device capable of further minimizing the ON resistance of a switching element. Switching element has field application electrode that is connected to semiconductor substrate with insulating film interposed therebetween. Field control unit of driving unit is connected to field application electrode and source electrode of switching element, and applies a bias voltage Ve between field application electrode and source electrode. Field control unit applies an electric field from field application electrode to a hetero-junction interface of semiconductor substrate, by applying the bias voltage Ve exceeding a threshold value to switching element. In short, in the ON state of switching element, the electric field that is applied from field application electrode to semiconductor substrate works to increase electron concentration in a channel region by a field effect and decrease the ON resistance of switching element.

10 Claims, 6 Drawing Sheets

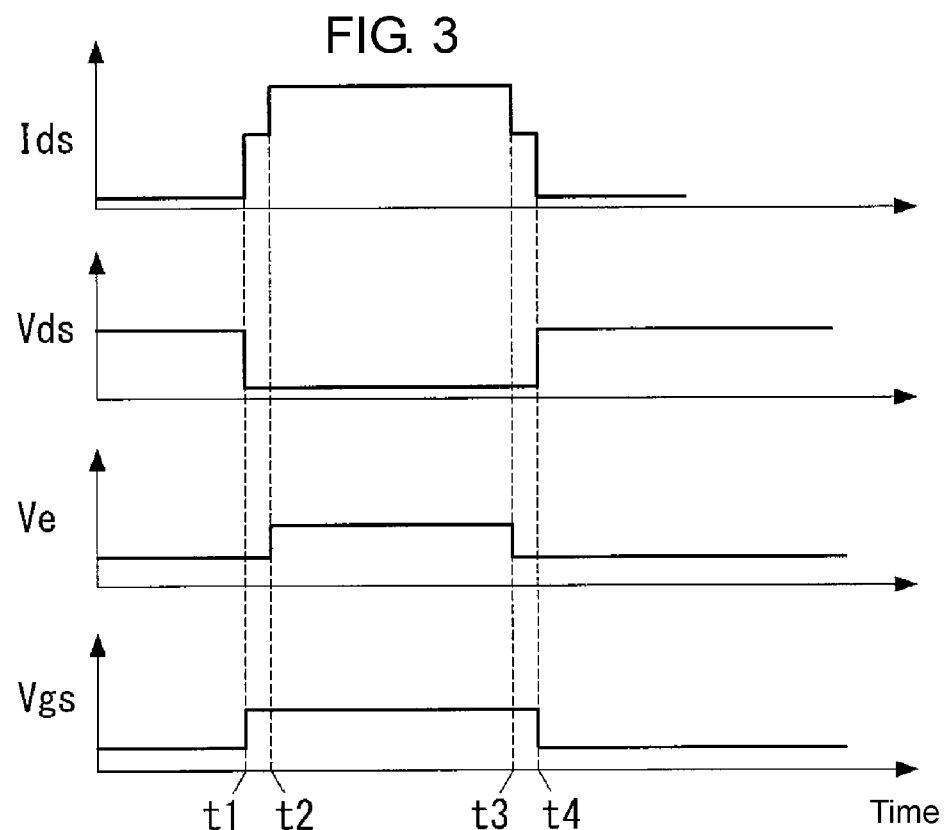
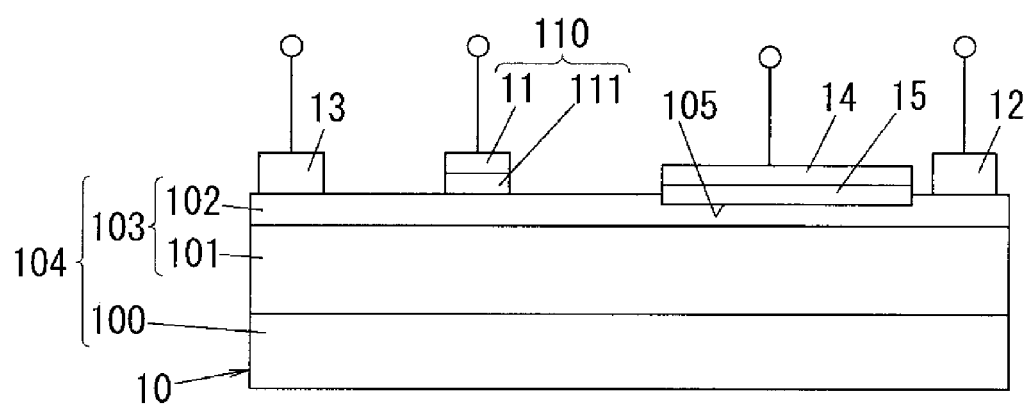

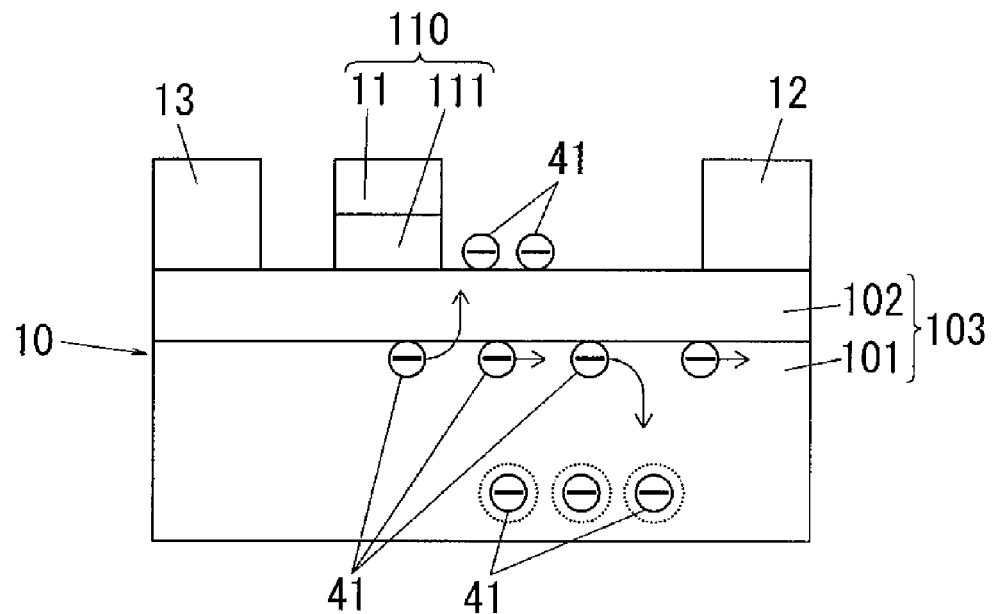
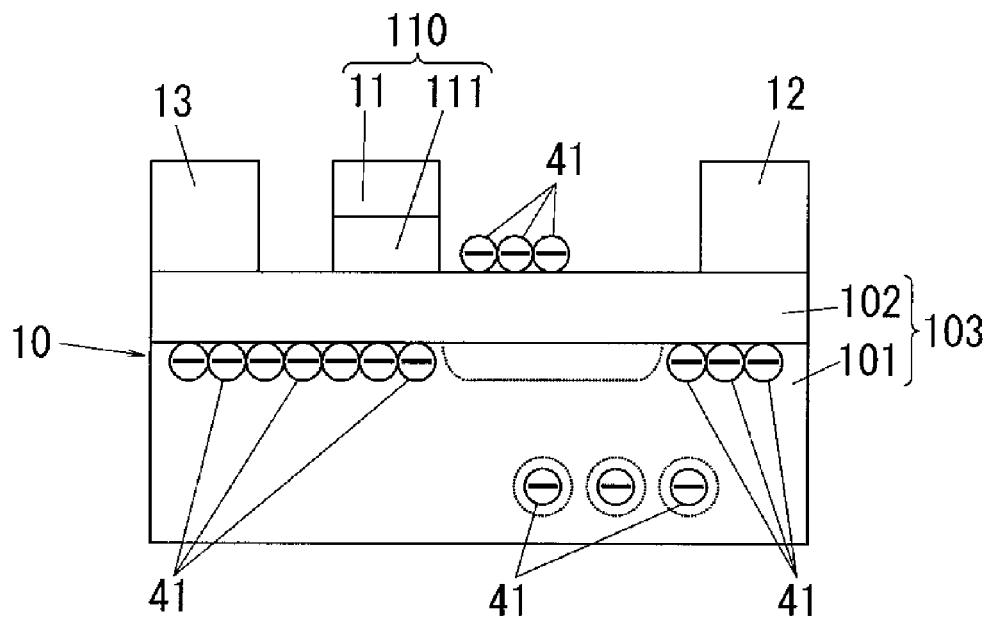

SWITCHING DEVICE

BACKGROUND

1. Technical Field

The present invention relates to a switching device that has a switching element made of a semiconductor element.

2. Background Art

Conventionally, there has been provided a switching device that has a switching element being a contactless switching element such as a triac, a thyristor, and a field-effect transistor (FET), and is configured to turn off and on (non-conduction and conduction) the switching element. This switching device performs a switching of power to be supplied from a power supply to a load, by having the switching element inserted between the load and the power supply of an illumination device or the like, for example.

In recent years, as a switching element that is used in this type of a switching device, attention is being focused on a semiconductor element that uses a nitride semiconductor such as gallium nitride (GaN) and a wide band-gap semiconductor such as silicon carbide (SiC). As an example of this type of a semiconductor element, there is an element that uses a 2-dimensional electron gas layer generated in an AlGaN/GaN hetero-interface as a channel layer (for example, see Unexamined Japanese Patent Publication No. 2010-176885; hereinafter, Patent Document 1).

According to the switching element described in Patent Document 1, a GaN layer and an AlGaN layer are stacked, and a first electrode, a second electrode, and an intermediate-potential part are formed on the surface of the AlGaN layer. Further, a gate (control electrode) is formed on the intermediate-potential part. Based on this configuration, in the switching element, a current flowing in the path between the first electrode and the second electrode changes, by a gate voltage (control signal) applied to the gate, in a state of a voltage being applied between the first electrode and the second electrode. In short, this switching element constitutes a normally-off type switching element in which the current path between the first electrode and the second electrode becomes non-conductive when the gate voltage becomes lower than a predetermined threshold value, and the current path between the first electrode and the second electrode becomes conductive when the gate voltage exceeds the threshold value.

A switching device that uses the switching element of the above configuration can minimize an ON resistance as an electric resistance that is present in the current path in the conductive state, as compared with the case of using a MOSFET (Metal-Oxide-Semiconductor FET), an IGBT (Insulated-Gate-Bipolar-Transistor), and the like.

SUMMARY

However, the configuration described in Patent Document 1 sometimes has a problem in that a loss occurs in the switching element when the voltage applied to the switching element is relatively high or when the current flowing in the switching element is relatively large. Therefore, it is desired to further minimize the ON resistance of the switching element.

The present invention has been achieved in view of the above problems, and an object of the present invention is to provide a switching device capable of further minimizing the ON resistance of the switching element.

The switching device of the present invention has a semiconductor substrate, a first electrode and a second electrode that are disposed on one surface of the semiconductor substrate, and a gate unit that is disposed between the first electrode and the second electrode on the one surface. The switching device has a switching element that makes a portion between the first electrode and the second electrode conductive by forming a channel region on the semiconductor substrate, when a gate voltage that exceeds a predetermined threshold value is applied to the gate unit, and a drive circuit that switches between ON and OFF of the switching element by applying the gate voltage to the gate unit of the switching element. The semiconductor substrate has a semiconductor-stacked body that is formed by stacking a first semiconductor layer and a second semiconductor layer and has a hetero-junction interface at a junction portion between the first semiconductor layer and the second semiconductor layer, and a 2-dimensional electron gas layer generated in the hetero-junction interface is used as the channel region. The switching element has a field application electrode that is connected to the semiconductor substrate with an insulating film interposed therebetween, and the drive circuit has a field control unit that applies an electric field to the hetero-junction interface from the field application electrode by applying a bias voltage to the field application electrode.

In this switching device, preferably, the field control unit applies an electric field to the hetero-junction interface by applying the bias voltage to the field application electrode, during an ON time of the switching element.

In this switching device, more preferably, the field control unit applies a direct-current voltage using the field application electrode for a positive electrode, as the bias voltage.

In this switching device, more preferably, the drive circuit has a voltage monitoring unit that measures a voltage applied between the first electrode and the second electrode of the switching element, as a device voltage, and the field control unit adjusts a magnitude of the bias voltage according to a measured value of the voltage monitoring unit.

In this switching device, more preferably, the field control unit applies an electric field to the hetero-junction interface by applying the bias voltage to the field application electrode, during a reset period that is set before a time point when the switching element is turned ON.

In this switching device, more preferably, the field control unit applies a direct-current voltage using the field application electrode for a negative electrode, as the bias voltage.

In this switching device, more preferably, the field application electrode is provided in a plural number.

In this switching device, more preferably, the field application electrode is disposed between a high-potential-side electrode out of the first electrode and the second electrode, and the gate unit.

In this switching device, more preferably, the gate unit is provided in a pair, and the field application electrode is disposed between the pair of gate units.

In this switching device, more preferably, the field control unit has an insulation-type power supply circuit of which a portion between an input end and an output end is electrically insulated, and applies the bias voltage, from the output end of the power supply circuit to the field application electrode, following an application signal that is applied to the input end of the power supply circuit.

The present invention has an advantage in that the ON resistance of the switching element can be further minimized, because the field control unit applies the electric field from the field application electrode to the hetero-junction interface by applying the bias voltage to the field application electrode.

BRIEF DESCRIPTION OF DRAWINGS

FIG. 3 is a graph showing a drain current Ids, a drain voltage Vds, a bias voltage Ve, and a gate voltage Vgs in the operation of the switching device according to the first embodiment;

FIG. 4 is an explanatory diagram of other configuration of the switching element used in the switching device according to the first embodiment;

FIG. 7A is an explanatory diagram of a mechanism of a current collapse; and

FIG. 7B is an explanatory diagram of the mechanism of the current collapse.

DETAILED DESCRIPTION OF THE PREFERRED EMBODIMENTS

First Exemplary Embodiment

Figure 1:
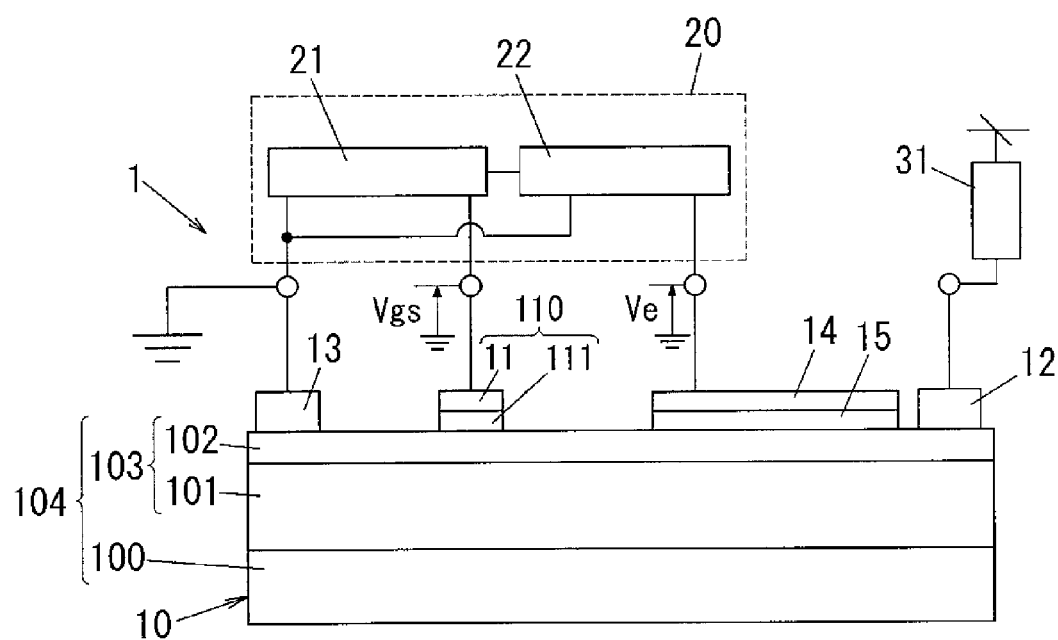
FIG. 1 is an explanatory diagram showing a schematic configuration of a switching device according to a first embodiment.

Switching device 1 according to the present embodiment has switching element 10 made of a semiconductor element, and drive circuit 20 that switches between a conduction (ON) and a block (OFF) of switching element 10 by applying a gate voltage to switching element 10, as shown in FIG. 1. In the example of FIG. 1, switching device 1 is used to switch supply power from a direct-current power supply (not shown) to load (electric device or the like) 31, and has switching element 10 that is inserted between the direct-current power supply and load 31.

Switching element 10 includes a field-effect transistor (FET) that has gate electrode 11, drain electrode 12 as a first electrode, and source electrode 13 as a second electrode. While a detailed configuration is described later, switching element 10 is made of an element that uses materials of a nitride semiconductor such as gallium nitride (GaN), and a wide band-gap semiconductor such as silicon carbide (SiC). The wide band-gap refers to a band gap (at least 2.2 eV) that is two times the band gap (1.1 eV) of silicon (Si) or larger, for example. With this arrangement, switching element 10 can realize a high withstand-voltage power device that has a relatively low ON resistance as an electric resistance existing in a current path in a conductive (ON) state and that can be also adapted to a large current. The wide band-gap semiconductor in this case is defined as a semiconductor that has a light element of the second period in the periodic table as a constituent element, for example.

Switching element 10 is connected to load 31 and the direct-current power supply such that a current path between drain electrode 12 and source electrode 13 is inserted into a series circuit of load 31 and the direct-current power supply. In this example, drain electrode 12 is connected to a positive electrode side of the direct-current power supply, and source electrode 13 is connected to a negative electrode side.

Drive circuit 20 switches between a conduction and a block of the current path between drain electrode 12 and source electrode 13 by applying a gate voltage Vgs between gate electrode 11 and source electrode 13. Switching element 10 constitutes a switch that blocks the current path between drain electrode 12 and source electrode 13 when the gate voltage Vgs becomes lower than a predetermined threshold value and that conducts the current path between drain electrode 12 and source electrode 13 when the gate voltage Vgs exceeds the threshold value. Therefore, switching element 10 constitutes a normally-off type switch when the threshold value is equal to or higher than 0 V, and constitutes a normally-on type switch when the threshold value is smaller than 0 V. Hereinafter, a case where switching element 10 constitutes the normally-off type switch is explained.

Drive circuit 20 has gate driving unit 21 that applies the gate voltage Vgs to switching element 10, and field control unit 22 that applies a bias voltage to field application electrode 14 described later. Gate driving unit 21 and field control unit 22 each consists of a direct-current voltage source of which a magnitude of an output voltage is variable. Gate driving unit 21 is connected to gate electrode 11 and source electrode 13, and applies the gate voltage Vgs exceeding the threshold value to switching element 10 such that switching element 10 is turned ON during an "H" level period of an ON/OFF signal, upon receiving the ON/OFF signal from outside. The gate voltage Vgs is a direct-current voltage, with source electrode 13 set at a reference potential (negative electrode) and gate electrode 11 set as a positive electrode. Field control unit 22 is described in detail later.

Figure 2A:
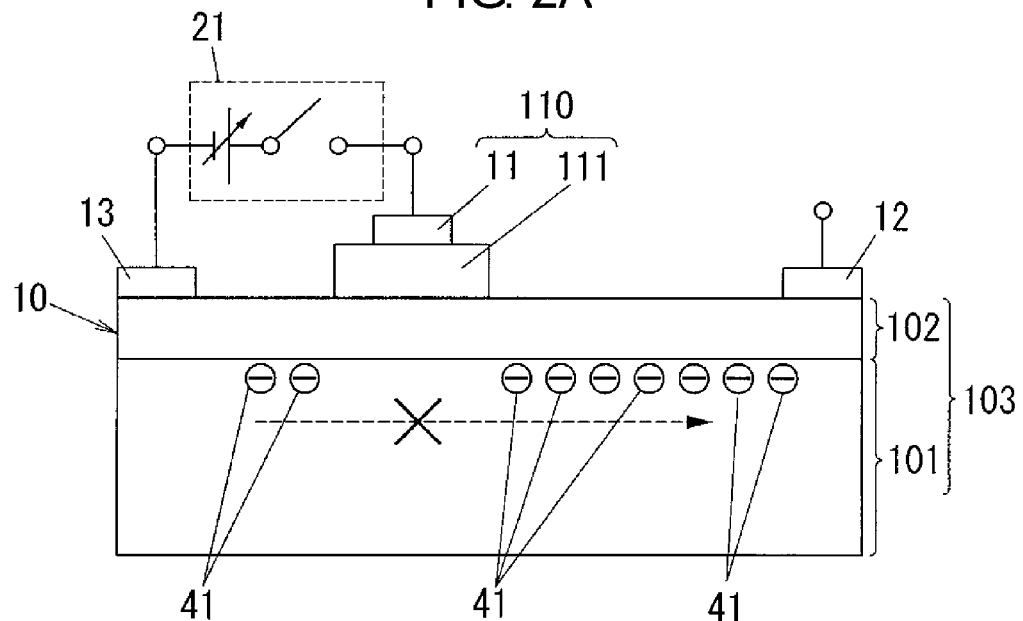
FIG. 2A is an explanatory diagram showing an operation of a switching element used in the switching device according to the first embodiment.
Figure 2B:
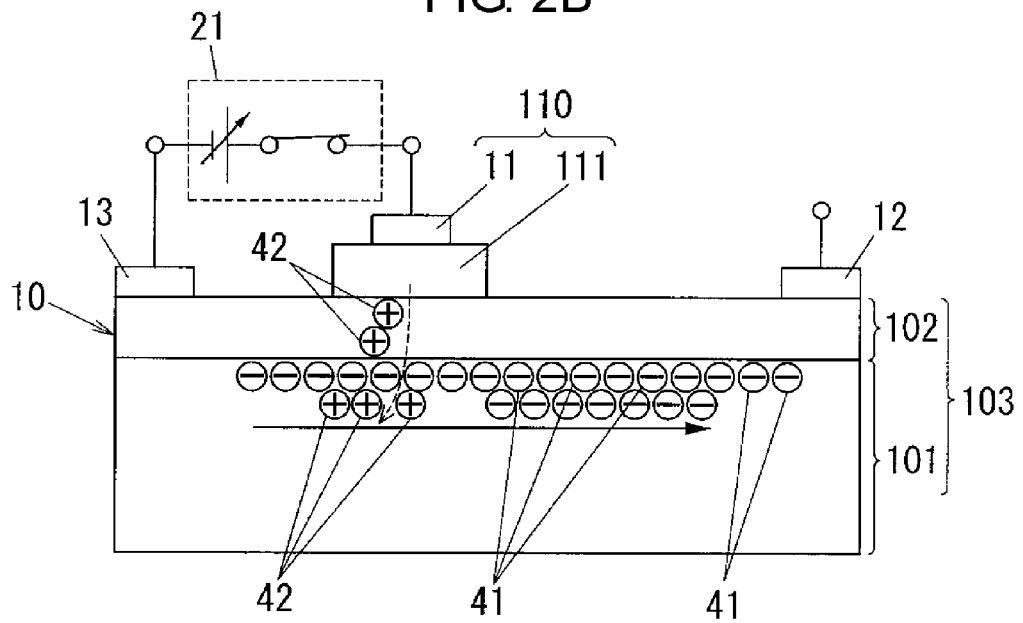
FIG. 2B is an explanatory diagram showing the operation of the switching element used in the switching device according to the first embodiment.

A basic configuration and an operation of switching element 10 according to the present embodiment are briefly explained next with reference to FIGS. 2A and 2B. In FIGS. 2A and 2B, gate driving unit 21 is expressed as an equivalent circuit of a power supply and a switch, and a supporting substrate and the like are suitably omitted from the drawings.

Switching element 10 has semiconductor-stacked body 103 that is formed on supporting substrate 100 (see FIG. 1) made of silicon (Si), with a buffer layer (not shown) interposed therebetween. Semiconductor-stacked body 103 is configured by having first semiconductor layer 101 and second semiconductor layer 102 stacked in this order from a supporting substrate 100 side, first semiconductor layer 101 being made of an undoped GaN layer, and second semiconductor layer 102 being made of an undoped AlGaN layer. Semiconductor-stacked body 103 constitutes semiconductor substrate 104 (see FIG. 1), together with supporting substrate 100 and the buffer layer. However, it suffices that semiconductor substrate 104 (see FIG. 1) has an active layer in which a channel region for causing electrons to move is included, and only semiconductor-stacked body 103 may be sufficient for semiconductor substrate 104.

Further, switching element 10 has control layer 111 that is formed at a part on second semiconductor layer 102. Control layer 111 consists of impurity-doped p-type AlGaN. Gate electrode 11 made of a metal material is stacked on control layer 111, and gate electrode 11 is in ohmic-junction with control layer 111. Gate electrode 11 and control layer 111 constitute gate unit 110.

Drain electrode 12 and source electrode 13 are formed by being isolated from each other at positions sandwiching control layer 111 on second semiconductor layer 102. That is, gate unit 110 is formed between drain electrode 12 and source electrode 13, on second semiconductor layer 102. In this example, gate unit 110 is disposed at a position near source electrode 13 instead of an intermediate position between drain electrode 12 and source electrode 13. In this way, a distance between gate unit 110 and drain electrode 12 is set larger than a distance between gate unit 110 and source electrode 13 for the purpose of securing a sufficient withstand voltage between gate unit 110 and drain electrode 12 of switching element 10.

In this case, a band gap of second semiconductor layer 102 is set larger than a band gap of first semiconductor layer 101, and a hetero barrier is formed in the interface of first semiconductor layer 101 and second semiconductor layer 102. Near the hetero-junction interface of first semiconductor layer 101 and second semiconductor layer 102, a high-concentration 2-dimensional electron gas (2 DEG) layer that becomes a channel region during an operation is formed by an influence of intrinsic polarization and piezoelectric polarization.

That is, first semiconductor layer 101 is formed with the channel region in which electrons move along the interface with second semiconductor layer 102, even when an impurity is not being doped with. Both drain electrode 12 and source electrode 13 are in ohmic-junction with the 2-dimensional electron gas layer, and gate electrode 11 is in ohmic-junction with control layer 111.

Based on the above configuration, when the gate voltage Vgs changes in a state of a voltage being applied between drain electrode 12 and source electrode 13, switching element 10 has the drain current flowing between drain electrode 12 and source electrode 13 changed in the principle explained below.

That is, when the gate voltage Vgs is 0 V, in switching element 10, the channel region immediately below gate unit 110 shown in FIG. 2A is depleted, and the drain current does not flow because the current path between drain electrode 12 and source electrode 13 is blocked. The depletion of the channel region occurs due to increase of a potential in the channel region by p-type control layer 111 that is formed between gate electrode 11 and second semiconductor layer 102. That is, when the gate voltage Vgs is 0 V, the 2-dimensional electron gas in the channel region is offset by holes, and a normally-off characteristic is realized.

On the other hand, when the gate voltage Vgs exceeds the predetermined threshold value, in switching element 10, the current path between drain electrode 12 and source electrode 13 becomes conductive as shown in FIG. 2B, and the drain current flows. That is, in switching element 10, when the gate voltage Vgs exceeding the threshold value is applied from drive circuit 20, the potential in the channel region immediately below gate unit 110 decreases. Then, electrons 41 are generated in the channel region, and the current path becomes conductive.

In the present embodiment, the threshold value of the gate voltage Vgs is set in a forward-on-voltage of a pn-junction that is formed between control layer 111 and the channel region. When the gate voltage Vgs exceeds the threshold value, holes 42 are injected from gate unit 110 into the channel region. At this time, because of existence of the potential barrier of the hetero-junction, few electrons 41 flow to gate unit 110, but electrons 41 of the equivalent amount of injected holes 42 are pulled to the hetero-junction interface. Generated electrons 41 move at high speeds toward drain electrode 12 by a drain voltage Vds. On the other hand, mobility of holes 42 in first semiconductor layer 101 is extremely small as compared with mobility of electrons 41, and therefore, most of holes 42 stay near gate unit 110. Therefore, holes 42 further generate the equivalent amount of electrons 41 and increase electrons 41 in the channel region.

Switching device 1 can minimize the ON resistance as the electric resistance that is present in the current path in the conductive (ON) state, as compared with the case of using a MOSFET, an IGBT, and the like by using switching element 10 of the above configuration.

Semiconductor materials that constitute first semiconductor layer 101, second semiconductor layer 102, and control layer 111 are not limited to nitride semiconductors, and may be silicon carbide (SiC) and the like, for example. Although switching element 10 employs a configuration having gate electrode 11 in ohmic-junction with control layer 111, the configuration is not limited to this, and gate electrode 11 may be in Schottky-junction with second semiconductor layer 102.

In switching device 1 of the present embodiment, switching element 10 has field application electrode 14 that is connected to semiconductor substrate 104 with insulating film 15 interposed therebetween as shown in FIG. 1. Field application electrode 14 applies an electric field to a hetero-junction interface (that is, an interface of first semiconductor layer 101 and second semiconductor layer 102) in semiconductor substrate 104, when the bias voltage Ve exceeding a predetermined threshold value is applied based on source electrode 13. The threshold value of the bias voltage Ve is set separately from the threshold value of the gate voltage Vgs.

Insulating film 15 is made of an insulating material, and is formed on one surface of semiconductor substrate 104 on which drain electrode 12, source electrode 13, and gate unit 110 are formed. That is, insulating film 15 is disposed at a position not interfering with any one of drain electrode 12, source electrode 13, and gate unit 110, on second semiconductor layer 102.

Field application electrode 14 is made of a metal material, and is stacked on insulating film 15. That is, field application electrode 14 is not directly connected to semiconductor substrate 104, but employs an insulation structure that has field application electrode 14 insulated from semiconductor substrate 104 by insulating film 15. In the example of FIG. 1, field application electrode 14 is disposed between high-potential-side drain electrode 12 out of drain electrode 12 and source electrode 13, and gate unit 110. However, preferably, field application electrode 14 is disposed at a position away from drain electrode 12.

Field control unit 22 of drive circuit 20 is connected to field application electrode 14 and source electrode 13 of switching element 10, and applies the bias voltage Ve between field application electrode 14 and source electrode 13. Field control unit 22 applies an electric field to the hetero-junction interface of semiconductor substrate 104 from field application electrode 14, by applying the bias voltage Ve exceeding the threshold value to switching element 10. The bias voltage Ve is a direct-current voltage, with source electrode 13 set at a reference potential (negative electrode) and field application electrode 14 set as a positive electrode. With this arrangement, a positive electric field is applied to the hetero-junction interface from field application electrode 14. On the other surface of semiconductor substrate 104, there is provided a substrate electrode (not shown) for determining a potential of semiconductor substrate 104. The substrate electrode is an electrode for determining a potential of supporting substrate 110, and is normally connected to source electrode 13.

In the present embodiment, field control unit 22 determines an application timing of the bias voltage Ve, by matching with an application timing of the gate voltage Vgs by gate driving unit 21. Specifically, field control unit 22 applies an electric field to the hetero-junction interface by applying the bias voltage Ve to field application electrode 14, during the ON time of switching element 10, with the gate voltage Vgs being applied, as shown in FIG. 3. FIG. 3 is a graph showing a drain current Ids that flows between drain electrode 12 and source electrode 13, the drain voltage Vds that is applied between drain electrode 12 and source electrode 13, the bias voltage Ve and the gate voltage Vgs.

That is, field control unit 22 applies the bias voltage Ve exceeding the threshold voltage to switching element 10, during a period from t2 to t3 that is set to be superposed with a period from t1 to t4 during which gate driving unit 21 applies the gate voltage Vgs exceeding the threshold value to switching element 10. In this case, it suffices that the period from t2 to t3 during which field control unit 22 applies the bias voltage Ve is included in the period from t1 to t4 during which gate driving unit 21 applies the gate voltage Vgs, and t2 may be equal to t1, and t3 may be equal to t4.

When the bias voltage Ve is applied to field application electrode 14 during an ON time of switching element 10, the ON resistance of switching element 10 becomes small and the drain current Ids (FIG. 3) becomes large even when the drain voltage Vds (FIG. 3) is constant, in the principle explained below.

That is, field application electrode 14 applies a positive electric field to the hetero-junction interface of semiconductor substrate 104 when the bias voltage Ve is applied during the ON time of switching element 10. At this time, electrons are pulled to the hetero-junction interface by a field effect. Generated electrons move at high speeds toward drain electrode 12 by the drain voltage Vds. In other words, because concentration of the 2-dimensional electron gas as the channel region becomes high, the ON resistance of switching element 10 becomes small.

In short, the electric field that is applied from field application electrode 14 to semiconductor substrate 104 works to increase electron concentration in the channel region and decrease the ON resistance of switching element 10 by the field effect. As a result, in the period from t2 to t3 during which the bias voltage Ve is being applied to field application electrode 14 in an ON state of switching element 10, the drain current Ids (FIG. 3) becomes large even when the drain voltage Vds (FIG. 3) is constant, and a loss generated in switching element 10 becomes small.

Field control unit 22 may also have an insulation-type power supply circuit (not shown) of which a portion between an input end and an output end is electrically insulated. In this case, field control unit 22 applies the bias voltage Ve between field application electrode 14 and source electrode 13 from the output end of the power supply circuit, following an application signal applied to the input end of the power supply circuit. The application signal applied to the input end of the power supply circuit is a signal for controlling the application timing of the bias voltage Ve, and is generated by a control unit (not shown) that integrally controls gate driving unit 21 and field control unit 22. While the explanation of a detailed configuration is omitted, the insulation-type power supply circuit is formed by a flyback converter using a flyback transformer, for example.

According to switching device 1 of the present embodiment explained above, there is an advantage in that the ON resistance of switching element 10 can be further minimized, as compared with a configuration not having field application electrode 14. That is, when field control unit 22 applies the bias voltage Ve to field application electrode 14 during the ON time of switching element 10, the concentration of the 2-dimensional electron gas as the channel region becomes high because the electrons are generated in the hetero-junction interface by the field effect. As a result, the ON resistance of switching element 10 becomes small.

Further, in the present embodiment, field application electrode 14 is disposed between drain electrode 12 and gate unit 110, on the same surface as drain electrode 12 and the like on semiconductor substrate 104. Therefore, the electric field to be applied from field application electrode 14 to semiconductor substrate 104 during the application of the bias voltage Ve is applied to a portion corresponding to between drain electrode 12 and gate unit 110 out of the hetero-junction interface of semiconductor substrate 104. Accordingly, switching element 10 can minimize the ON resistance by increasing electrons at the portion corresponding to between drain electrode 12 and gate unit 110 in the channel region, while realizing the high withstand voltage by securing a large distance between drain electrode 12 and gate unit 110. Because the holes are injected from gate unit 110 into the channel region immediately below gate unit 110, switching element 10 has the 2-dimensional electron gas in high concentration in a large portion of the channel region ranging from immediately below gate unit 110 to drain electrode 12.

Switching element 10 may be provided with field application electrode 14 on a bottom surface of concave part 105 with insulating film 15 interposed therebetween, by forming this concave part 105 on a part of the surface of second semiconductor layer 102 by digging the surface by etching, as shown in FIG. 4. In this configuration, the field effect generated during the application of the bias voltage Ve can be controlled by the etching of second semiconductor layer 102.

Field application electrode 14 may be provided between gate unit 110 and source electrode 13, instead of between drain electrode 12 and gate unit 110. Further, field application electrode 14 may be provided in a plural number. For example, field application electrode 14 may be provided both between drain electrode 12 and gate unit 110 and between gate unit 110 and source electrode 13, or field application electrode 14 may be provided in a plural number between drain electrode 12 and gate unit 110. When field application electrode 14 is provided in a plural number, field control unit 22 can apply electric fields from plural field application electrodes 14 to semiconductor substrate 104, by applying the bias voltage Ve to plural field application electrodes 14. Therefore, concentration of the 2-dimensional electron gas becomes high at plural positions in the channel region, and switching device 1 can further minimize the ON resistance of switching element 10.

Switching element 10 used in switching device 1 may be in a dual-gate structure having a pair of gate units 110 provided between drain electrode 12 and source electrode 13 on semiconductor substrate 104. Switching element 10 in the dual-gate structure is equivalent to a circuit having two transistors connected in series so as to connect between drain electrodes, and constitutes a bidirectional switch capable of switching a current flowing in both directions between drain electrode 12 and source electrode 13.

Figure 5A:
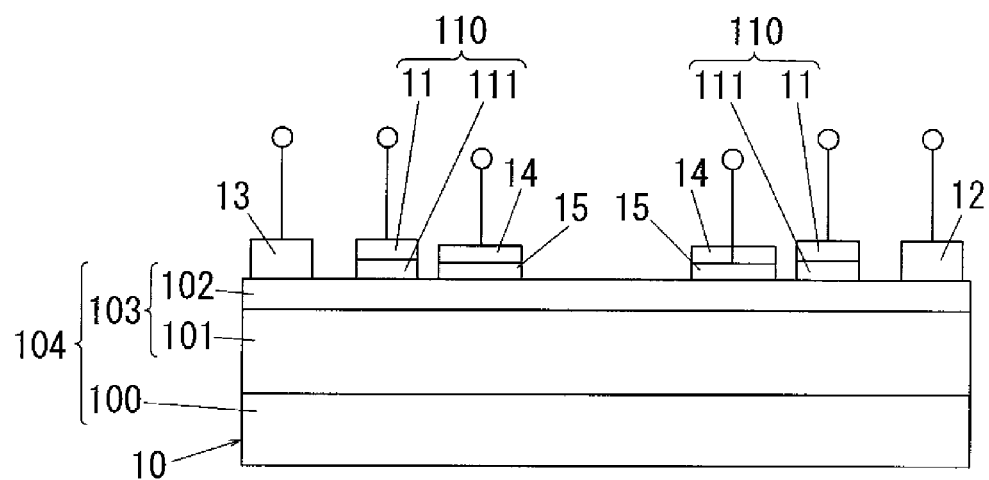
FIG. 5A is an explanatory diagram of other configuration of the switching element used in the switching device according to the first embodiment.
Figure 5B:
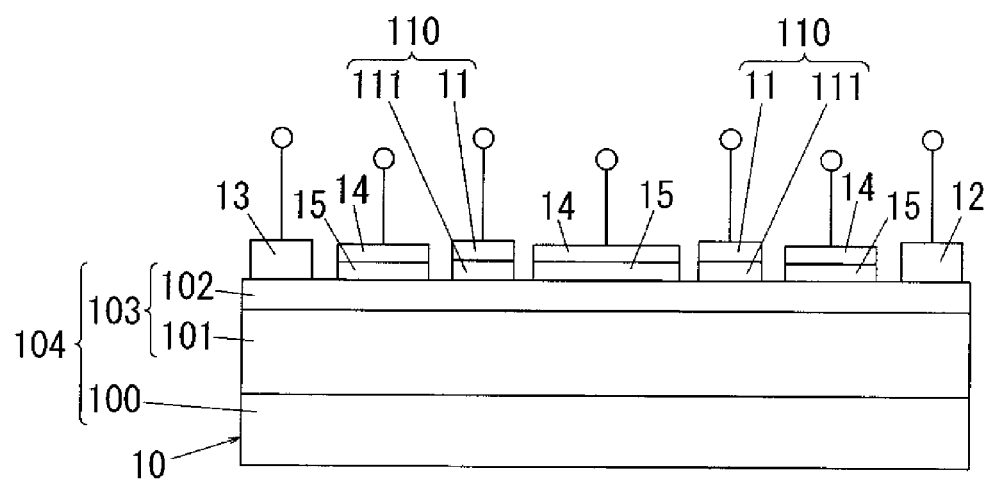
FIG. 5B is an explanatory diagram of other configuration of the switching element used in the switching device according to the first embodiment.

In switching element 10 of the dual-gate structure, field application electrode 14 is disposed as exemplified in FIGS. 5A and 5B, for example. In the example of FIG. 5A, two field application electrodes 14 are provided, and each field application electrode 14 is disposed at a position adjacent to each gate unit 110 between the pair of gate units 110 on second semiconductor layer 102. In this case, field control unit 22 sets the bias voltage Ve to be applied to field application electrode 14 at a source electrode 13 side, based on a potential of source electrode 13, and sets the bias voltage Ve to be applied to field application electrode 14 at a drain electrode 12 side, based on the potential of drain electrode 12. In the example of FIG. 5B, three field application electrodes 14 are provided, and field application electrodes 14 are provided between gate electrode 110 and drain electrode 12 at one side, between gate electrode 110 and source electrode 13 at the other side, and between both gate electrodes 110, respectively, on second semiconductor layer 102.

Figure 6:
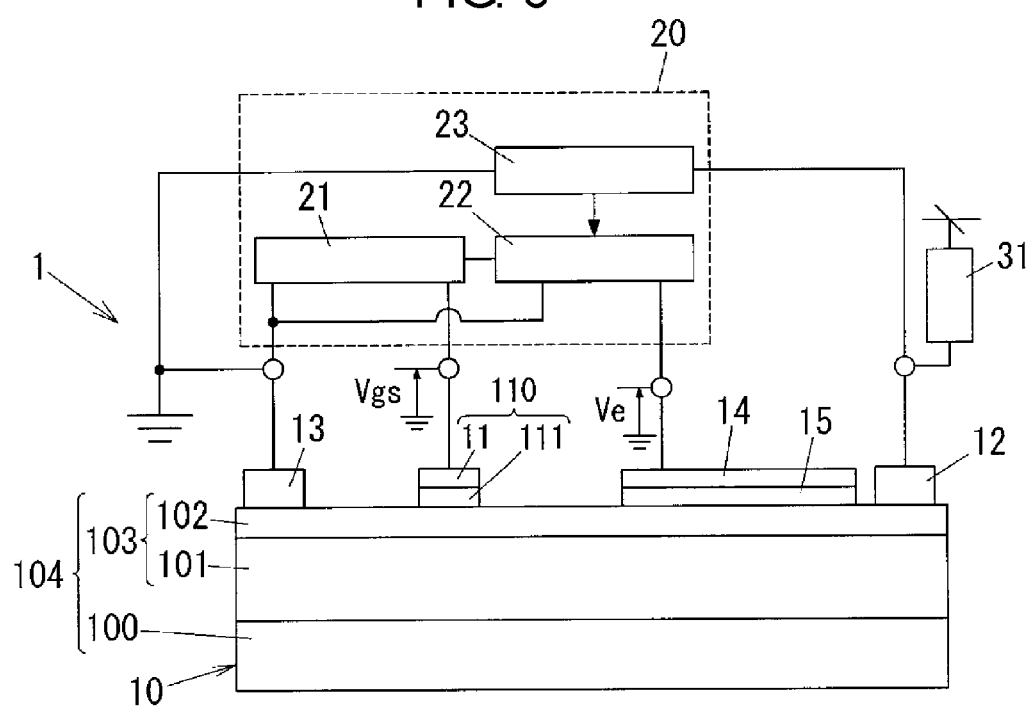
FIG. 6 is an explanatory diagram of other configuration of the switching device according to the first embodiment.

As other example of the present embodiment, drive circuit 20 may be configured to have voltage monitoring unit 23 that measures the drain voltage Vds as shown in FIG. 6, and field control unit 22 may adjust a magnitude of the bias voltage Ve according to a measured value of voltage monitoring unit 23. Voltage monitoring unit 23 is connected to drain electrode 12 and source electrode 13 of switching element 10, measures the drain voltage Vds as a device voltage applied between both ends (between drain electrode 12 and source electrode 13) of switching element 10, and inputs the measured value to field control unit 22. Field control unit 22 adjusts the magnitude of the bias voltage Ve according to the magnitude of the drain voltage Vds that is input from voltage monitoring unit 23, such that the bias voltage Ve becomes larger when the drain voltage Vds becomes larger.

According to this configuration, switching device 1 can cause switching element 10 to operate in a state suitable for the magnitude of the drain voltage Vds, because the strength of the electric field applied from field application electrode 14 to the hetero-junction interface changes depending on the magnitude of the drain voltage Vds. That is, when the drain voltage Vds is relatively small, switching device 1 can minimize power consumption of field control unit 22 by decreasing the field strength applied from field application electrode 14. On the other hand, when the drain voltage Vds is relatively large, switching device 1 can further minimize the ON resistance of switching element 10 by increasing the field strength applied from field application electrode 14. Therefore, power loss of switching element 10 can be minimized.

In the present embodiment, gate unit 110 is configured by a p-type AlGaN layer (control layer 111) that is formed at a part on semiconductor layer 102, and gate electrode 11 that is provided on control layer 111. However, the configuration is not limited to this configuration. For example, gate unit 110 may be an insulation gate structure that is configured by an insulating film formed on second semiconductor device 102, and gate electrode 11 provided on the insulating film.

Second Exemplary Embodiment

Switching device 1 in the present embodiment is different from switching device 1 in the first embodiment in that the timing of application of the bias voltage Ve to field application electrode 14 by field control unit 22 is different from the application timing in the first embodiment. Hereinafter, configurations similar to those in the first embodiment are assigned with common marks, and their explanations are suitably omitted.

In the present embodiment, field control unit 22 applies an electric field to the hetero-junction interface by applying the bias voltage Ve to field application electrode 14, during a reset period that is set before a time point when the switching element 10 is turned ON triggered by start of application of the gate voltage Vgs by gate driving unit 21. Specifically, field control unit 22 applies the bias voltage Ve, triggered by the change of an ON/OFF signal from an "L" level to an "H" level, simultaneously with or immediately before the application of the gate voltage Vgs by gate driving unit 21. A length of the reset period when field control unit 22 applies the bias voltage Ve is suitably set.

In the present embodiment, a direction of the electric field applied from field application electrode 14 to the hetero-junction interface is also different from the direction in the first embodiment. That is, in this case, the bias voltage Ve is a direct-current voltage, with source electrode 13 set at a reference potential (positive electrode) and field application electrode 14 set as a negative electrode. With this arrangement, a negative electric field is applied from field application electrode 14 to the hetero-junction interface.

In this way, field control unit 22 applies the electric field from field application electrode 14 to the hetero-junction interface of semiconductor substrate 104, before switching element 10 is turned ON after application of the gate voltage Vgs to switching element 10. Accordingly, switching device 1 of the present embodiment can suppress a phenomenon called a current collapse that the ON resistance of switching element 10 increases and a saturation value of the drain current Ids decreases due to application of a high voltage between drain electrode 12 and source electrode 13 of switching element 10.

The current collapse is explained below with reference to FIGS. 7A and 7B. FIGS. 7A and 7B schematically show switching element 10 in an OFF state without application of the gate voltage Vgs.

In this state, when the drain voltage Vds at a high voltage (about 100 V, for example) is applied between drain electrode 12 and source electrode 13, switching element 10 has a strong electric field applied in concentration to an end part at a high-potential side (at a drain electrode 12 side) of gate unit 110. This electric field accelerates electrons in the 2-dimensional electron gas, and accelerated electrons 41 are trapped by crystal defects in the semiconductor-stacked body 103 and the like, as shown in FIG. 7A. As a result, switching element 10 has an occurrence of electron traps between mainly gate unit 110 and drain electrode 12, and concentration of the 2-dimensional gas as the channel region decreases, as shown in FIG. 7B.

Thereafter, in switching element 10, trapped electrons 41 are released when a portion between drain electrode 12 and source electrode 13 becomes in the conductive state by application of the gate voltage Vgs. However, it sometimes takes time to release electrons 41. In this case, in switching element 10, electrons 41 that are kept being trapped even in the ON state narrow the channel region, and the drain current Ids does not sufficiently increase. This is considered to be the reason for the occurrence of the current collapse. Therefore, in switching element 10, once the high voltage is applied between drain current 12 and source electrode 13, it sometimes occurs thereafter that the ON resistance increases and the drain current Ids decreases.

On the other hand, according to switching device 1 of the present embodiment, field control unit 22 applies the electric field from field application electrode 14 by applying the bias voltage Ve, during the reset period before switching element 10 is turned ON. Therefore, switching device 1 can compensate for the electrons of the 2-dimensional electron gas that decreased by the electron trap. That is, in switching element 10, when a negative electric field is applied from field application electrode 14 to the hetero-junction interface before switching element 10 is turned ON, the electric field in an opposite polarity to that of the electric field that becomes the cause of the electron trap is applied to the hetero-junction interface. The electric field of the opposite polarity forcibly discharges the trapped electrons. Therefore, the electrons that were decreased by the electron trap can be instantaneously returned to the hetero-junction interface. As a result, the concentration of the 2-dimensional electron gas as the channel region becomes high, and the ON resistance of switching element 10 becomes small.

Field control unit 22 can be arranged to control such that a positive electric field is applied from field application electrode 14 to the hetero-junction interface by applying a direct-current voltage, with source electrode 13 set at the reference potential (negative electrode) and field application electrode 14 set as a positive electrode, as the bias voltage Ve, during the reset period. Also in this case, switching element 10 has the concentration of the 2-dimensional electron gas as the channel region increased before switching element 10 is turned ON, and the ON resistance becomes small.

According to switching device 1 of the present embodiment explained above, the increase of the ON resistance attributable to the current collapse can be suppressed, by field control unit 22 that applies the electric field from field application electrode 14 before switching element 10 is turned ON.

The layout of field application electrode 14 can be suitably set as explained in the first embodiment. However, because field application electrode 14 corresponds to the electron trap between gate unit 110 and drain electrode 12, field application electrode 14 is disposed preferably at a position adjacent to gate unit 110 between gate unit 110 and drain electrode 12. When switching element 10 used in switching device 1 is in the dual-gate structure having a pair of gate units 110, field application electrodes 14 are respectively disposed preferably at positions adjacent to gate units 110 between both gate units 110. When field application electrode 14 is disposed in this way, switching device 1 can efficiently remove the trapped electrons that become the cause of the current collapse, by field control unit 22 that applies the electric field from field application electrode 14.

Field control unit 22 may apply the electric field to the hetero-junction interface by applying the bias voltage Ve to field application electrode 14 during the ON time of switching element 10 as in the first embodiment, as well as in the reset period before switching element 10 is turned ON. With this arrangement, switching device 1 has an advantage in that the ON resistance of switching element 10 be further minimized.

Other configurations and functions are similar to those in the first embodiment.

What is claimed is:

1. A switching device comprising:
   a switching element that has a semiconductor substrate, a first electrode and a second electrode disposed on one surface of the semiconductor substrate, and a gate unit disposed between the first electrode and the second electrode on the one surface, and that makes a portion between the first electrode and the second electrode conductive by forming a channel region on the semiconductor substrate when a gate voltage exceeding a predetermined threshold voltage is applied to the gate unit; and
   a drive circuit that switches between ON and OFF of the switching element by applying the gate voltage to the gate unit of the switching element, wherein
   the semiconductor substrate includes a semiconductor-stacked body formed by having a first semiconductor layer and a second semiconductor layer stacked, has a hetero-junction interface at a junction portion between the first semiconductor layer and the second semiconductor layer, and uses a 2-dimensional electron gas layer generated in the hetero-junction interface as the channel region,
   the switching element has a field application electrode that is connected to the semiconductor substrate with an insulating film interposed therebetween, and
   the drive circuit has a field control unit that applies an electric field to the hetero-junction interface from the field application electrode by applying a bias voltage to the field application electrode.

2. The switching device according to claim 1, wherein the field control unit applies an electric field to the hetero-junction interface by applying the bias voltage to the field application electrode, during an ON time of the switching element.

3. The switching device according to claim 2, wherein the field control unit applies a direct-current voltage using the field application electrode for a positive electrode, as the bias voltage.

4. The switching device according to claim 2, wherein the drive circuit has a voltage monitoring unit that measures a voltage applied between the first electrode and the second electrode of the switching element, as a device voltage, and
   the field control unit adjusts a magnitude of the bias voltage according to a measured value of the voltage monitoring unit.

5. The switching device according to claim 1, wherein the field control unit applies an electric field to the hetero-junction interface by applying the bias voltage to the field application electrode, during a reset period that is set before a time point when the switching element is turned ON.

6. The switching device according to claim 5, wherein the field control unit applies a direct-current voltage using the field application electrode for a negative electrode, as the bias voltage.

7. The switching device according to claim 1, wherein the field application electrode is provided in a plurality of number.

8. The switching device according to claim 1, wherein the field application electrode is disposed between a high-potential-side electrode out of the first electrode and the second electrode, and the gate unit.

9. The switching device according to claim 1, wherein the gate unit is provided in a pair, and
   the field application electrode is disposed between the pair of gate units.

10. The switching device according to claim 1, wherein the field control unit has an insulation-type power supply circuit of which a portion between an input end and an output end is electrically insulated, and applies the bias voltage, from the output end of the power supply circuit to the field application electrode, following an application signal applied to the input end of the power supply circuit.

* * * * *